United States Patent
Tzeng et al.

(10) Patent No.: US 8,115,535 B2
(45) Date of Patent: Feb. 14, 2012

(54) LEAKAGE CURRENT SUPPRESSING CIRCUIT AND SEMICONDUCTOR CHIP

(75) Inventors: Tzu-Chien Tzeng, Hsinchu (TW); Tay-Her Tsaur, Tainan (TW); Jian Liu, Jiangsu Province (CN)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 12/424,675

(22) Filed: Apr. 16, 2009

(65) Prior Publication Data

US 2009/0261896 A1 Oct. 22, 2009

(30) Foreign Application Priority Data

Apr. 18, 2008 (TW) ................. 97114221 A (51) Int. Cl.
*H03K 3/01* (2006.01)
(52) U.S. Cl. ............ 327/534; 327/544; 327/427
(58) Field of Classification Search .......... 327/534–535, 327/544, 427, 434
See application file for complete search history.

(56) References Cited

U.S. PATENT DOCUMENTS

| 5,767,733 | A | * | 6/1998 | Grugett | 327/534 |
| 6,111,455 | A | * | 8/2000 | Eleyan et al. | 327/537 |
| 6,456,150 | B1 | * | 9/2002 | Sacco et al. | 327/534 |
| 6,525,594 | B2 | * | 2/2003 | Fugate et al. | 327/534 |
| 7,233,179 | B2 | * | 6/2007 | White | 327/112 |
| 7,301,388 | B2 | * | 11/2007 | Kim | 327/536 |
| 7,683,696 | B1 | * | 3/2010 | Le | 327/534 |

FOREIGN PATENT DOCUMENTS
TW I264177 10/2006

OTHER PUBLICATIONS
Foreign Office Action for 96A-094TW mailed May 25, 2011.
* cited by examiner

*Primary Examiner* — Quan Tra
(74) *Attorney, Agent, or Firm* — Thomas, Kayden, Horstemeyer & Risley, LLP (57) ABSTRACT

A leakage current suppressing circuit includes a bias generating unit and a switch unit. The bias generating unit is adapted to be coupled to a power source and an output terminal, and generates a bias voltage substantially equal to a voltage at the power source when the power source is turned on, and substantially equal to a voltage at the output terminal when the power source is turned off. The switch unit includes a first P-type transistor having a first terminal adapted to be coupled to the power source, a second terminal adapted to be coupled to the output terminal, a gate terminal, and a body terminal coupled to the bias generating unit for receiving the bias voltage therefrom.

21 Claims, 9 Drawing Sheets

LEAKAGE CURRENT SUPPRESSING CIRCUIT AND SEMICONDUCTOR CHIP

CROSS-REFERENCE TO RELATED APPLICATION

This application claims priority of Taiwanese Application No. 097114221, filed on Apr. 18, 2008.

BACKGROUND OF THE INVENTION

1. Field of the Invention

The invention relates to a leakage current suppressing circuit and a semiconductor chip, more particularly to a leakage current suppressing circuit and a semiconductor chip suppressing a leakage current via a pull-up resistor.

2. Description of the Related Art

A high definition multimedia interface (HDMI) is an audio/video communication interface for transmitting non-compressed encrypted digital data streams, and enables coupling of multiple audio/video sources (e.g., set top box, blue-ray disc player, etc.) to an audio device and/or a video monitor (e.g., digital television).

Figure 1:
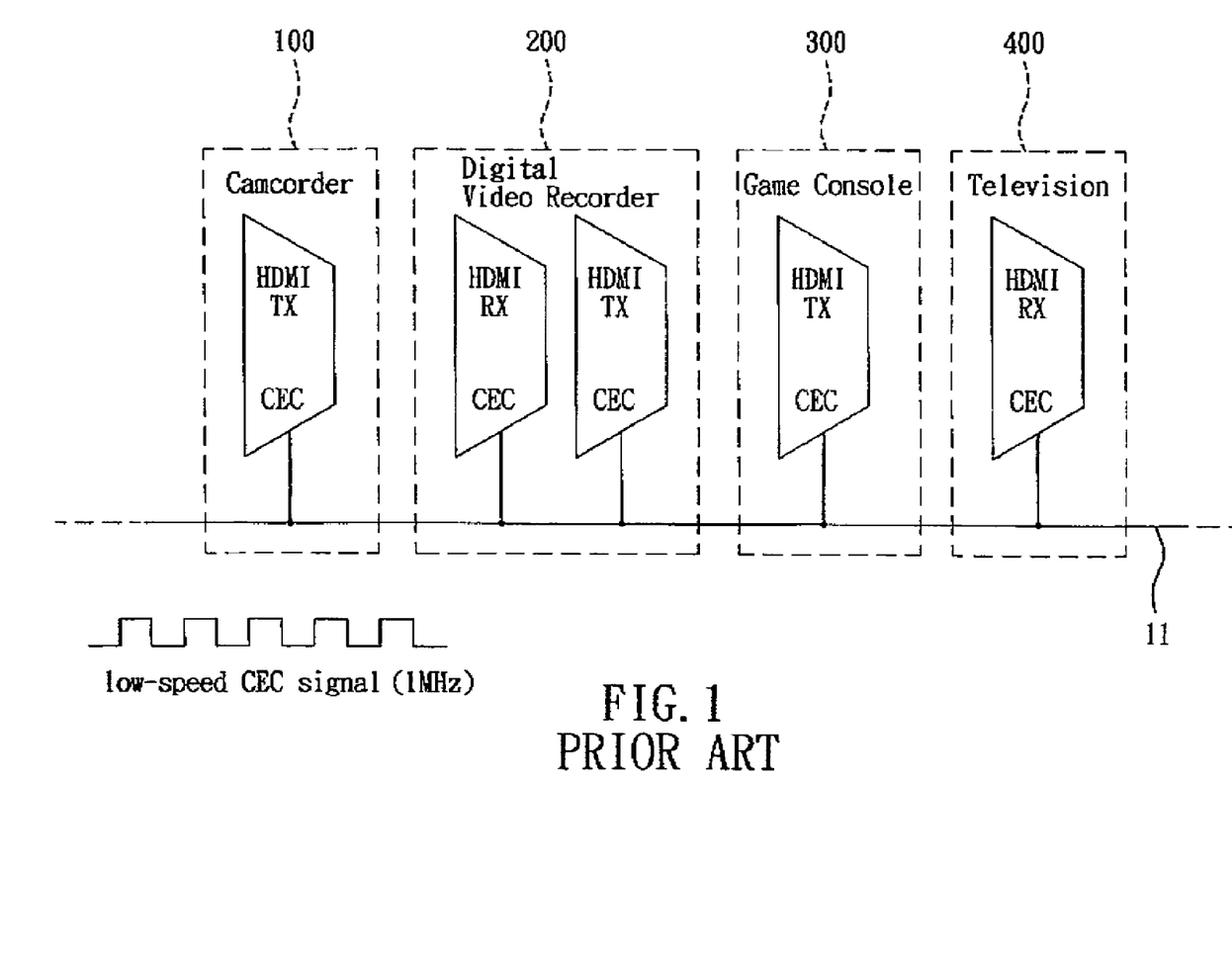
FIG. 1 is a schematic diagram showing an audio-video system composed of a plurality of audio-video devices, each of which includes an HDMI interface.

FIG. 1 is a schematic diagram showing an audio-video system composed of a plurality of audio-video devices, each of which includes an HDMI. With reference to FIG. 1, a consumer electronics control (CEC) signal line 11 is used for controlling all devices that are coupled to the HDMI, as set forth in the HDMI specification. In the example shown in FIG. 1, the audio-video devices include a camcorder 100, a digital video recorder (DVR) 200, a game console 300, and a television 400.

Figure 2:
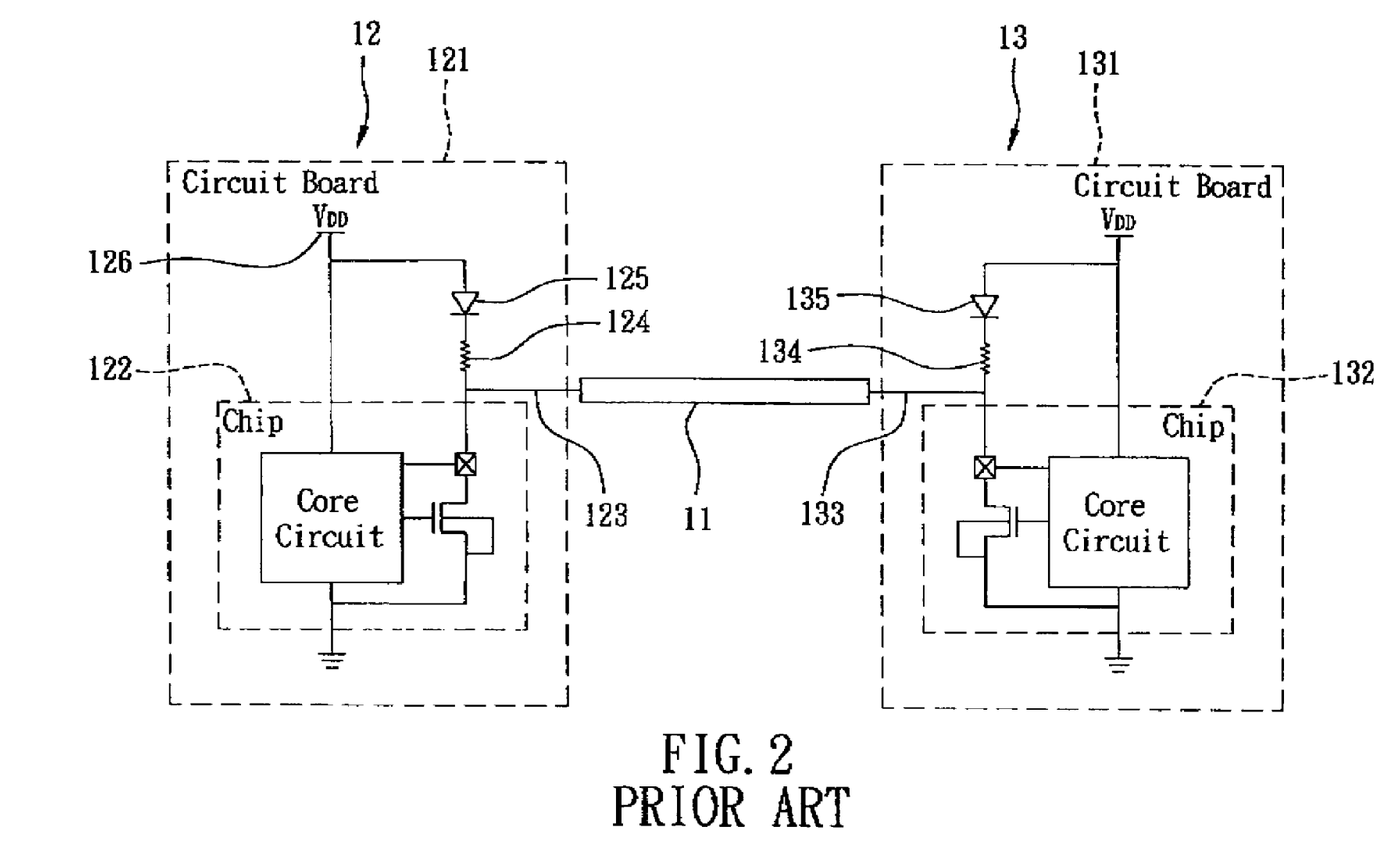
FIG. 2 is a circuit block diagram illustrating a circuit arrangement for suppressing leakage current in the prior art.

FIG. 2 is a circuit block diagram of two devices 12 and 13 connected by a CEC signal line 11. The devices 12, 13 may be any of the audio-video devices 100-400 of FIG. 1. In general, each of the devices 12, 13 includes a circuit board 121, 131, and a chip 122, 132 disposed on the circuit board 121, 131. Each chip 122, 132 uses an open drain or similar means to drive the CEC signal line 11 at an output terminal 123, 133 thereof. Therefore, the HDMI specification suggests adding a 27KΩ pull-up resistor 124, 134 on the circuit board 121, 131 for providing a high voltage level at the output terminal 123, 133. Resistance of each pull-up resistor 124, 134 has a drift that falls within the range of ±5%. When one of the devices 12, 13 (e.g., device 12) is turned off, while the other one of the devices 12, 13 (e.g., device 13) is turned on, it is necessary to avoid leakage of current from the turned-on device 13 into a power source 126 of the turned-off device 12 via the CEC signal line 11 and the pull-up resistor 124 of the turned-off device 12. To this end, the HDMI specification suggests adding a diode 125, 135 in series with the pull-up resistor 124, 134 on the circuit board 121, 131 so as to limit direction of current flow.

If the suggestions on the HDMI specification are adopted, manufacturing costs of the devices 12, 13 are increased due to the addition of the resistors 124, 125 and the relatively costly diodes 125, 135. Further, since voltage drop across each diode 125, 135 during forward bias is non-zero, equivalent resistance of the series-connected resistor 124, 134 and diode 125, 135 is greater than the actual resistance of the resistor 124, 134. In addition, the difference between the equivalent resistance and the actual resistance increases as voltage level ($V_{DD}$) of the corresponding power source 126, 136 decreases.

SUMMARY OF THE INVENTION

Therefore, the object of the present invention is to provide a circuit that is capable of suppressing leakage current, and that is relatively inexpensive.

According to one aspect of the present invention, there is provided a leakage current suppressing circuit that is adapted to be coupled to a power source and an output terminal. The leakage current suppressing circuit includes a bias generating unit and a switch unit. The bias generating unit is adapted to be coupled to the power source and the output terminal, and generates a bias voltage substantially equal to a voltage at the power source when the power source is turned on, and substantially equal to a voltage at the output terminal when the power source is turned off. The switch unit includes a first P-type transistor having a first terminal adapted to be coupled to the power source, a second terminal adapted to be coupled to the output terminal, a gate terminal, and a body terminal coupled to the bias generating unit for receiving the bias voltage therefrom.

Another object of the present invention is to provide a semiconductor chip that can reduce manufacturing costs.

According to another aspect of the present invention, there is provided a semiconductor chip that is adapted to be coupled to a power source and an output terminal. The semiconductor chip includes a core circuit, a resistor unit, a unidirectional current circuit, and a semiconductor substrate. The core circuit is adapted to be coupled to the output terminal. The resistor unit is adapted to be coupled to the output terminal. The unidirectional current circuit is adapted to be coupled between the resistor unit and the power source for permitting current flow from the power source to the output terminal when the power source is turned on, and for essentially suppressing current flow from the output terminal to the power source when the power source is turned off. The core circuit, the resistor unit and the unidirectional current circuit are commonly disposed on the semiconductor substrate.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF TEE PREFERRED EMBODIMENTS

Before the present invention is described in greater detail, it should be noted that that the consumer electronics control (CEC) signal output for a high definition multimedia interface (HDMI) is used hereinbelow as an illustrative example of an application of the present invention. However, it should be understood by those skilled in that art that the present invention is not limited to such an application, and is also applicable to audio-video interfaces that use other low-speed signal transmission standards utilizing open-drain or the like for signal output, such as digital visual interfaces (DVI), Display Port interfaces, and unified display interfaces (UDI), etc.

Figure 3:
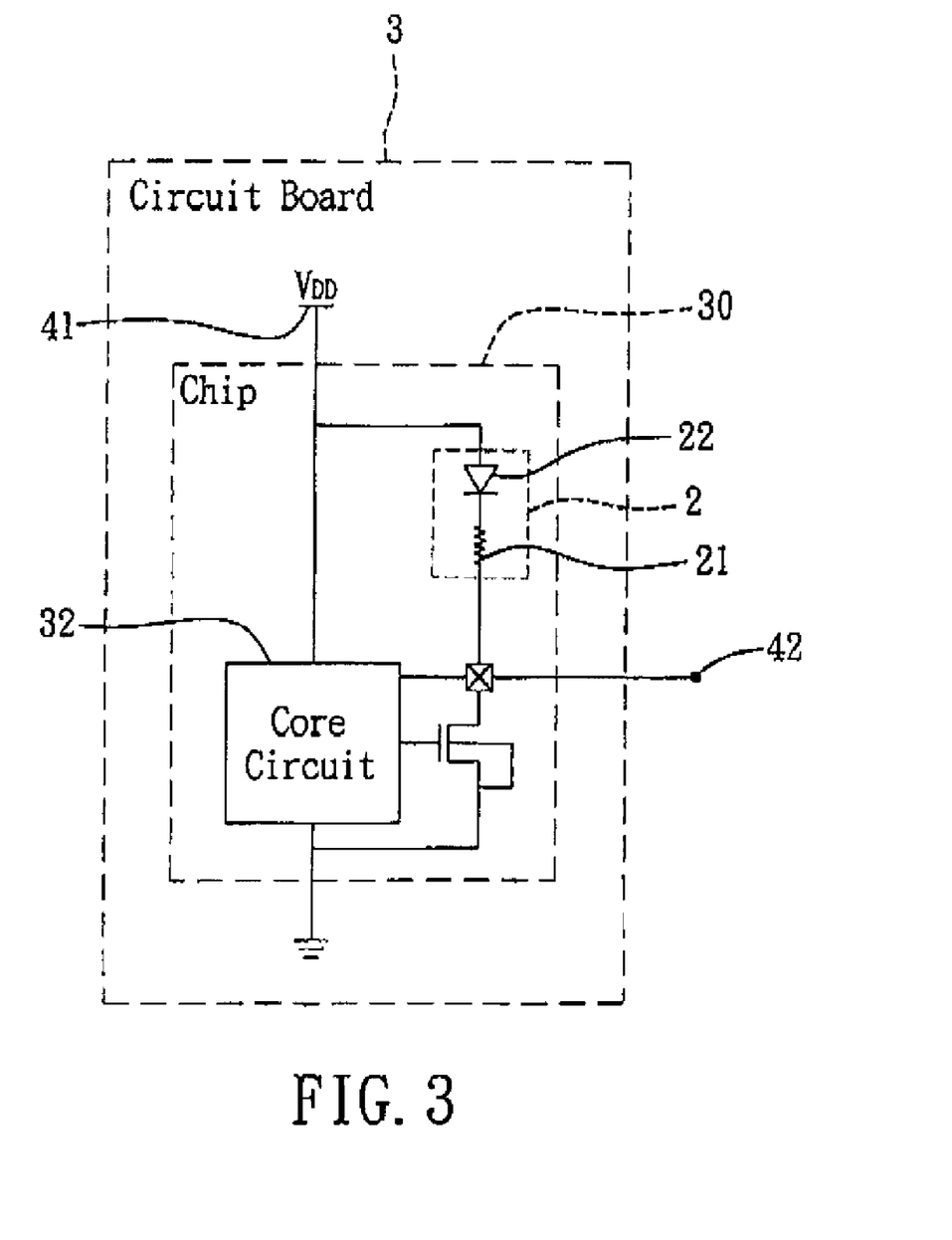
FIG. 3 is a circuit block diagram of a first embodiment of a leakage current suppressing circuit according to the present invention.

As shown in FIG. 3, the first embodiment of a leakage current suppressing circuit 2 according to the present invention is embedded in a chip 30, and is adapted to be coupled to a power source 41 and an output terminal 42. The chip 30 is disposed on a circuit board 3, and includes a core circuit 32 that is adapted to be coupled to the output terminal 41. The leakage current suppressing circuit 2 includes a pull-up resistor 21 and a diode 22. The diode 22 has an anode that is adapted to be coupled to the power source 41, and a cathode that is adapted to be coupled to the output terminal 42 via the pull-up resistor 21. With the diode 22 embedded in the chip 30, when the chip 30 or an audio-video apparatus provided with the chip 30 is turned off (i.e., the power source 41 is turned off such that a voltage ($V_{DD}$) at the power source 41 is zero), since the diode 22 is reverse biased, current is prevented from flowing from the output terminal 42 to the power source 41 via the pull-up resistor 21. It should be noted herein that due to semiconductor manufacturing process drifts, resistance of the pull-up resistor 21 normally has a drift that falls within the range of ±20%. The relatively high range of drift can be diminished to ±5% through adjustments in the semiconductor manufacturing process.

By embedding the pull-up resistor 21 and the diode 22 within the chip 30 such that external connections of a pull-up resistor and a diode are no longer required as with the prior art, manufacturing cost of the leakage current suppressing circuit 2 is reduced. However, similar to the prior art, the difference between equivalent and actual resistances due to the non-zero voltage drop across the diode 22 during forward bias still exists. In addition, it should be noted herein that the diode 22 is used in the first embodiment for illustrative purposes only. The present invention is not limited in this aspect, and other semiconductor circuit components or configurations equivalent to the diode 22 in function may be used in other embodiments of the present invention, an example of which follows.

Figure 4:
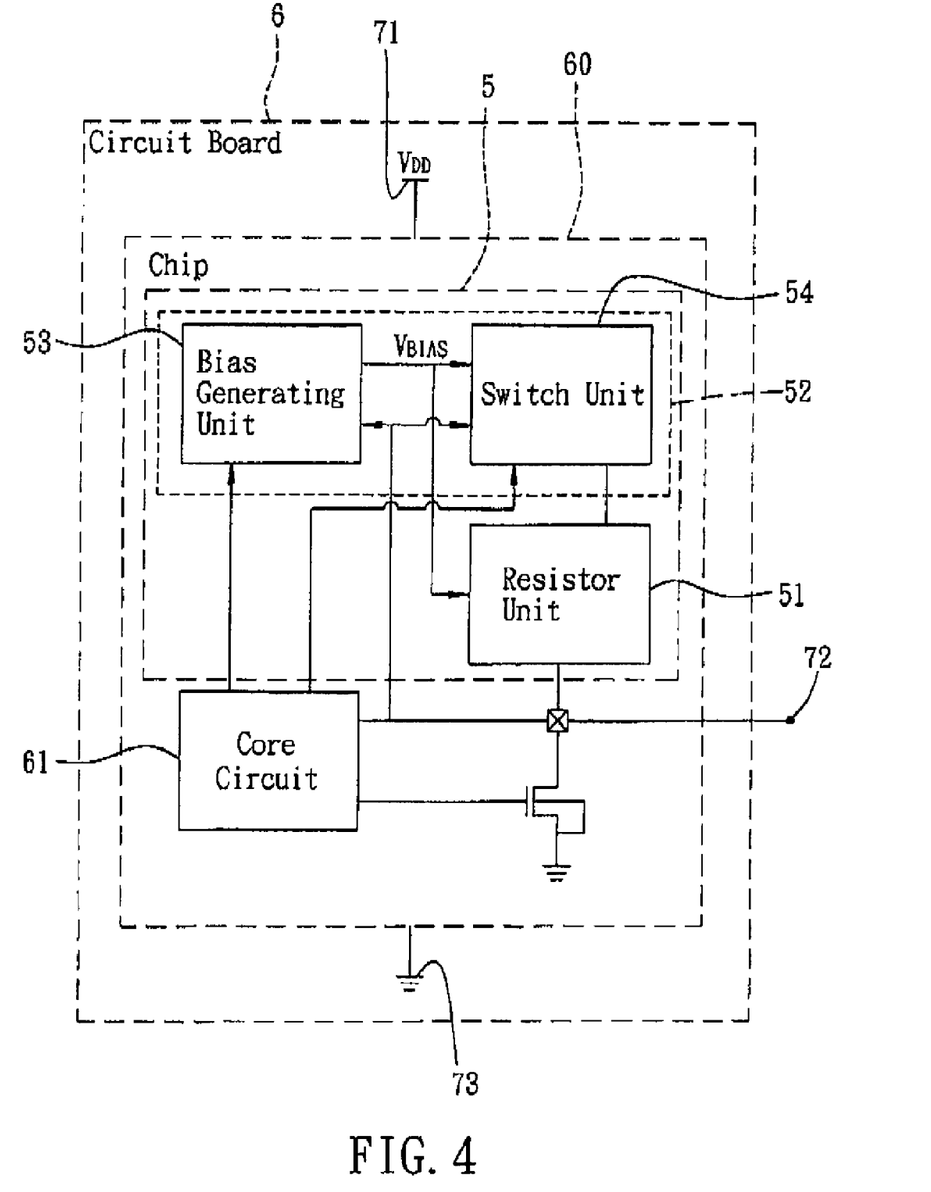
FIG. 4 is a circuit block diagram of a second embodiment of a leakage current suppressing circuit according to the present invention.

As shown in FIG. 4, the second embodiment of a leakage current suppressing circuit 5 according to the present invention is adapted to be embedded in a chip 60, and is adapted to be coupled to a power source 71, an output terminal 72, and a ground terminal 73. The chip 60 is disposed on a circuit board 6. Aside from the leakage current suppressing circuit 5, the chip 60 further includes a core circuit 61 that is adapted to be coupled to the output terminal 72, and a semiconductor substrate (not shown), on which the core circuit 61 and the leakage current suppressing circuit 5 are commonly disposed. The leakage current suppressing circuit 5 includes a resistor unit 51 and a unidirectional current circuit 52.

Figure 5A:
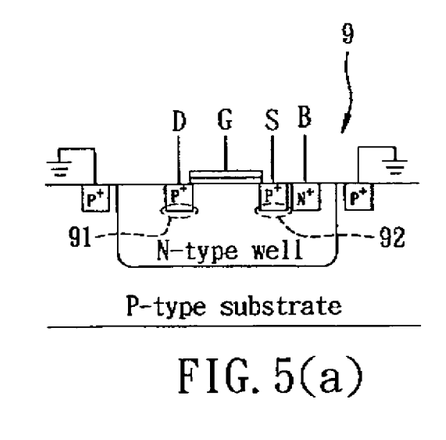
FIG. 5(a) is a schematic diagram of a P-type metal oxide semiconductor (PMOS) transistor.
Figure 5B:
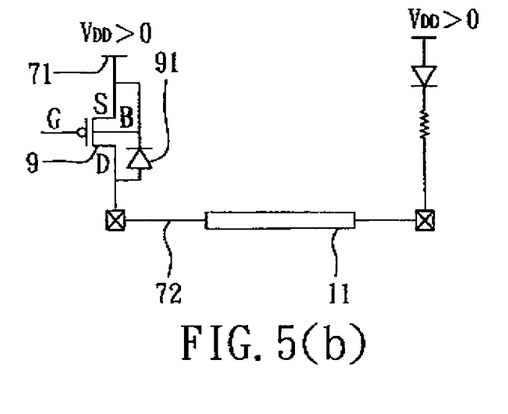
FIG. 5(b) and FIG. 5(c) are circuit diagrams illustrating operation of the second embodiment.
Figure 5C:
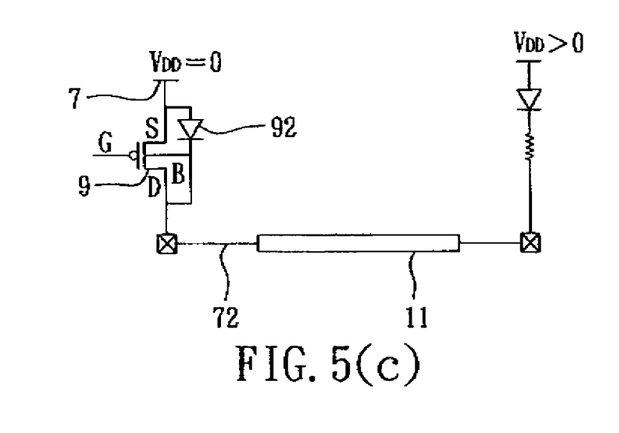

Before describing further details of the resistor unit 51 and the unidirectional current circuit 52, operating principles of the this embodiment will be explained with reference to FIG. 5(a), FIG. 5(b) and FIG. 5(c). FIG. 5(a) illustrates a P-type metal oxide semiconductor (PMOS) transistor 9. As shown in FIG. 5(b), the PMOS 9 has a source terminal (S) that is adapted to be coupled to the power source 71, a drain terminal (D) adapted to be coupled to the output terminal 72, a gate terminal (G), and a body terminal (B) (also referred to as a bulk terminal, which is the N-type well shown in FIG. 5(a)).

Under normal operating conditions, it is desirable for the body terminal (B) and the source terminal (S) to have identical voltage levels, which is achieved by tying the body terminal (B) to the source terminal (S), in order to eliminate body effect of the PMOS transistor 9. However, when the power source 71 is turned off (i.e., the voltage ($V_{DD}$) is equal to zero) such that the PMOS transistor 9 is turned off, it is still possible for current to flow from the output terminal 72 to the power source 71 via a parasitic diode 91 between the drain terminal (D) and the body terminal (B) since the parasitic diode 91 is under forward bias. As shown in FIG. 5(c), under this situation, if the body terminal (B) and the drain terminal (D) have identical voltage levels, which is achieved by tying the body terminal (B) to the source terminal (S), current will be unable to flow from the output terminal 72 to the power source 71 via a parasitic diode 92 between the body terminal (B) and the source terminal (S) since the parasitic diode 92 is under reverse bias. Consequently, when the diode 22 in FIG. 3 is replaced with the PMOS transistor 9, by making the PMOS transistor 9 have connections shown in FIG. 5(b) when the power source 41 in FIG. 3 is turned on, the body effect of the PMOS transistor 9 is eliminated, and by making the PMOS transistor 9 have connections shown in FIG. 5(c) when the power source 41 in FIG. 3 is turned off, leakage current is prevented from flowing from the output terminal 72 to the power source 71. Moreover, since the voltage drop across the PMOS transistor 9 when the same is turned on is very close to zero (far smaller than the voltage drop across the diode 22 of FIG. 3 under forward bias), the replacement of the diode 22 with the PMOS 9 substantially removes the adverse effect of the diode 22 on equivalent resistance under forward bias.

Details of the resistor unit 51 and the unidirectional current circuit 52 will now be disclosed. It should be noted herein that since the source terminal (S) and the drain terminal (D) of a MOS transistor may interchange under different voltage conditions, first and second terminals (T1, T2) are used hereinafter in order to avoid confusion. When the first terminal (T1) operates as the source terminal (S), the second terminal (T2) operates as the drain terminal (D), and vice versa.

With reference to FIG. 4, the resistor unit 51 is adapted to be coupled to the output terminal 72. The unidirectional current circuit 52 is adapted to be coupled between the resistor unit 51 and the power source 71 for permitting current flow from the power source 71 to the output terminal 72 when the power source 71 is turned on (i.e., a voltage ($V_{DD}$) at the power source 71 is greater than zero), and for essentially suppressing current flow from the output terminal 72 to the power source 71 when the power source 71 is turned off (i.e., the voltage ($V_{DD}$) is zero).

Figure 7:
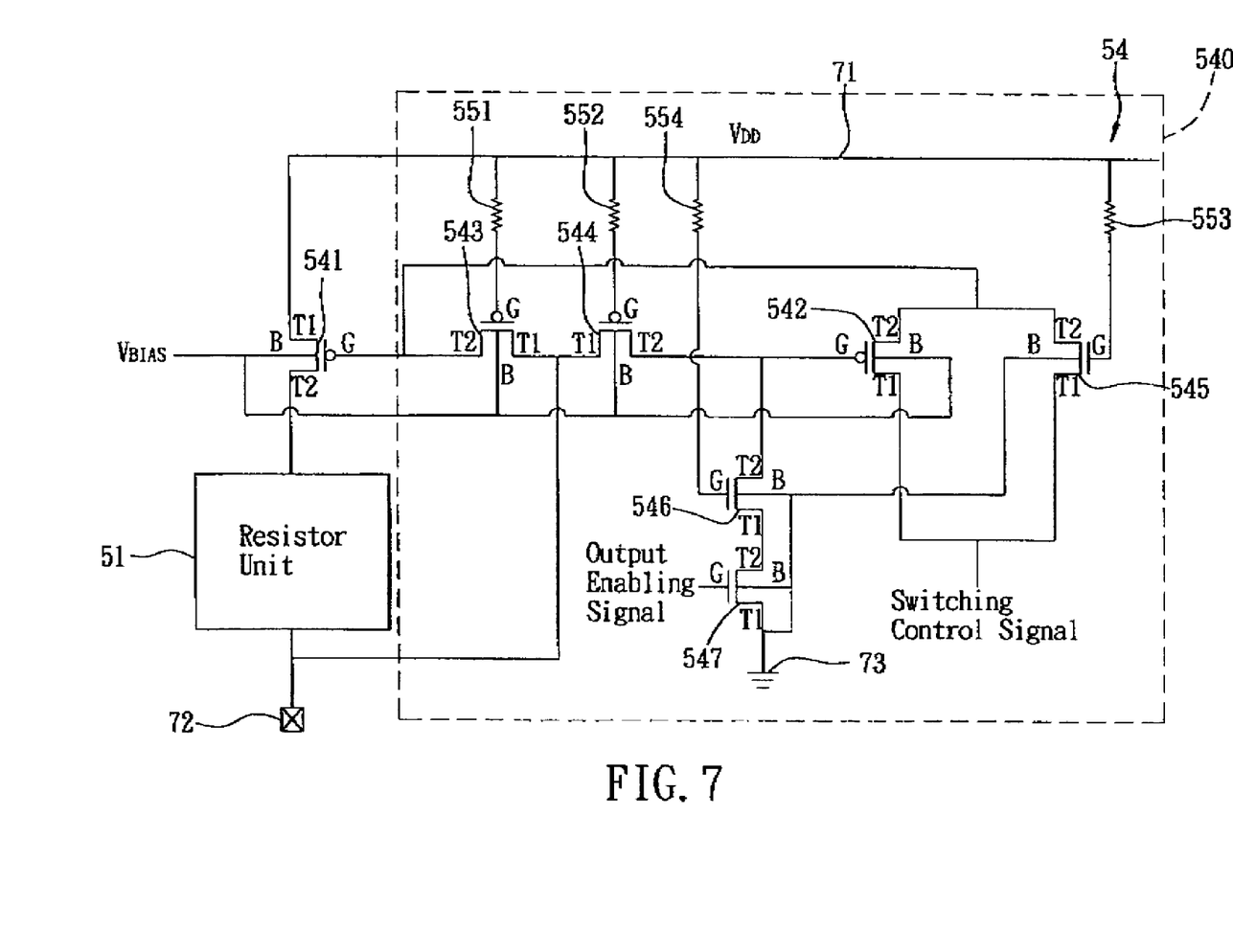
FIG. 7 is a circuit diagram illustrating a switch unit of the second embodiment.

In this embodiment, the unidirectional current circuit 52 includes a bias generating unit 53 and a switch unit 54. The bias generating unit 53 is adapted to be coupled to the power source 71 and the output terminal 72, and generates a bias voltage ($V_{BIAS}$) substantially equal to a voltage at the power source 71 when the power source 71 is turned on, and substantially equal to a voltage at the output terminal 72 when the power source 71 is turned off. As shown in FIG. 7, the switch unit 54 includes a first P-type transistor 541 that has a first terminal (T1) adapted to be coupled to the power source 71, a second terminal (T2) adapted to be coupled to the output terminal 72, a gate terminal (G), and a body terminal (B) coupled to the bias generating unit 53 for receiving the bias voltage ($V_{BIAS}$) therefrom. The is resistor unit 51 is adapted to be coupled between the second terminal (T2) of the first P-type transistor 541 and the output terminal 72.

Figure 6:
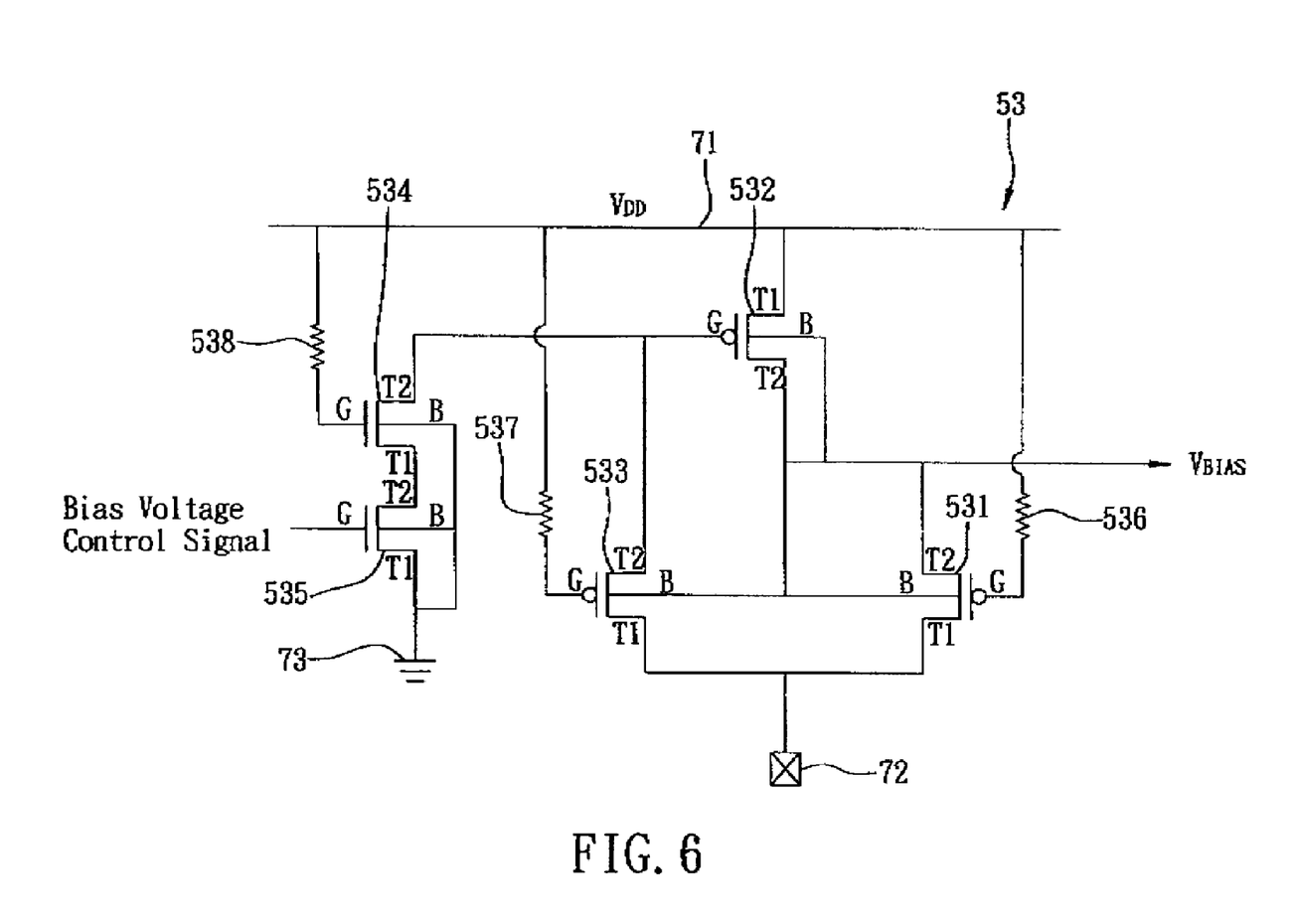
FIG. 6 is a circuit diagram illustrating a bias generating unit of the second embodiment.

As shown in FIG. 6, the bias generating unit 53 includes a second P-type transistor 531, a third F-type transistor 532, a fourth P-type transistor 533, a first N-type transistor 534, a first resistor 536, a second resistor 537, and a third resistor 538.

The second P-type transistor 531 has a first terminal (T1) adapted to be coupled to the output terminal 72, a second terminal (T2) coupled to the first P-type transistor 541 of the switch unit 54 for outputting the bias voltage ($V_{BIAS}$) thereto, a gate terminal (G) adapted to be coupled to the power source 71 via the first resistor 536, and a body terminal (B) coupled to the second terminal (T2) thereof.

The third P-type transistor 532 has a first terminal (T1) adapted to be coupled to the power source 71, a second terminal (T2) coupled to the second terminal (T2) of the second P-type transistor 531, a body terminal (B) coupled to the second terminal (T2) of the second P-type transistor 531, and a gate terminal (G) coupled to the second terminal of the fourth P-type transistor 533.

The fourth P-type transistor 533 has a first terminal (T1) adapted to be coupled to the output terminal 72, a second terminal (T2) coupled to the gate terminal (G) of the third P-type transistor 532, a gate terminal (G) adapted to be coupled to the power source 71 via the second resistor 537, and a body terminal (B) coupled to the second terminal (T2) of the second P-type transistor 532.

The first N-type transistor 534 has a first terminal (T1) adapted to be coupled to the ground terminal 73, a second terminal (T2) coupled to the gate terminal (G) of the third P-type transistor 533, a gate terminal (G) adapted to be coupled to the power source 71 via the third resister 538, and a body terminal (B) adapted to be coupled to the ground terminal 73.

Optionally, the bias generating unit 53 further includes a second N-type transistor 535 that has a first terminal (T1) adapted to be coupled to the ground terminal 73, a second terminal (T2) coupled to the first terminal (T1) of the first N-type transistor 534, a gate terminal (G) adapted for receiving a bias voltage control signal from the core circuit 61, and a body terminal (B) adapted to be coupled to the ground terminal 73. The bias generating unit 53 permits electrical connection between the first N-type transistor 534 and the ground terminal 73 according to the bias voltage control signal.

When the power source 71 is turned on (i.e., the voltage ($V_{DD}$) at the power source 71 is greater than zero), and when a voltage at the output terminal 72 is not greater than the voltage ($V_{DD}$), the second P-type transistor 531 and the fourth P-type transistor 533 are turned off. If the second N-type transistor 535 is turned on by the bias voltage control signal, then the first N-type transistor 534 is turned on, such that the ground potential from the ground terminal 73 is transferred to the gate terminal (G) of the third P-type transistor 532, thereby turning on the third P-type transistor 532. Since the second P-type transistor 531 is turned off, the bias voltage ($V_{BIAS}$) is substantially equal to the voltage ($V_{DD}$) at the power source 71.

On the other hand, when the power source 71 is turned off (i.e., the voltage ($V_{DD}$) at the power source 71 is zero), and when the voltage at the output terminal 72 is greater than the voltage ($V_{DD}$), the second P-type transistor 531 and the fourth P-type transistor 533 are turned on. Since the first N-type transistor 534 is turned off, the voltage at the output terminal 72 is transferred to the gate terminal (G) of the third P-type transistor 532, such that the third P-type transistor 532 is turned off. Since the second P-type transistor 531 is turned on, the bias voltage ($V_{BIAS}$) is substantially equal to the voltage at the output terminal 72. At this time, due to the absence of current paths from the output terminal 72 to the power source 71 and to the ground terminal 73, leakage current is prevented from flowing from the output terminal 72 to the power source 71.

It should be noted herein that the first, second and third resistors 536, 537, 538 are added to this embodiment for preventing the second P-type transistor 531, the fourth P-type transistor 533 and the first N-type transistor 534 from damage by events of electrical static discharge (ESD). Therefore, the first, second and third resistors 536, 537, 535 may be omitted in other embodiments of the present invention, where ESD is not an important consideration. Under such a circumstance, the gate terminals (G) of the second P-type transistor 531, the fourth P-type transistor 533 and the first N-type transistor 534 are connected to the power source 71.

It should be further noted herein that the second N-type transistor 535, which is controlled by the bias voltage control signal, is also optional. The second N-type transistor 535 is added to this embodiment for permitting common use of the output terminal 72 or for preventing current from flowing from the output terminal 72 to the power source 71 when the voltage at the output terminal 72 is greater than a non-zero voltage (VDC) at the power source 71 (i.e., the power source 71 is turned on). The second N-type transistor 535 may be omitted in other embodiments of the present invention, where the first terminal (T1) of the first N-type transistor 534 is connected to the ground terminal 73.

As shown in FIG. 7, in addition to the first P-type transistor 541, the switch unit 54 further includes a switch control sub-unit 540 that is adapted to be coupled to the power source 71 and the output terminal 72. The switch control sub-unit 540 is coupled to the first P-type transistor 541, and is operable to transmit a switching control signal from the core circuit 61 to the gate terminal (G) of the first P-type transistor 541 when the power source 71 is turned on, and to transmit the voltage ($V_{DD}$) at the output terminal 71 to the gate terminal (G) of the first P-type transistor 541 when the power source 71 is turned off.

The first P-type transistor 541 is to be disposed at a position corresponding to the diode 22 of FIG. 3 to achieve the same function, i.e., to prevent leakage current from flowing from the output terminal 72 to the power source 71 when the power source 71 is turned off.

In this embodiment, the switch control sub-unit 540 includes a fifth P-type transistor 542, a sixth P-type transistor 543, a seventh P-type transistor 544, a third N-type transistor 545, a fourth N-type transistor 546, a fourth resistor 551, a fifth resistor 552, a sixth resistor 553, and a seventh resistor 554.

The fifth P-type transistor 542 has a first terminal (T1) for receiving the switching control signal from the core circuit 61, a second terminal (T2) coupled to the gate terminal (G) of the first P-type transistor 541, a gate terminal (G), and a body terminal (B) coupled to the bias generating unit 53 (as shown in FIG. 4) for receiving the bias voltage ($V_{BIAS}$) therefrom.

The sixth P-type transistor 543 has a first terminal (T1) adapted to be coupled to the output terminal 72, a second terminal (T2) coupled to the gate terminal (G) of the first P-type transistor 541, a gate terminal (G) adapted to be coupled to the power source 71 via the fourth resistor 551, and a body terminal (B) coupled to the bias generating unit 53 for receiving the bias voltage ($V_{BIAS}$) therefrom.

The seventh P-type transistor 544 has a first terminal (T1) adapted to be coupled to the output terminal 72, a second terminal (T2) coupled to the gate terminal (G) of the fifth P-type transistor 542, a gate terminal (G) adapted to be coupled to the power source 71 via the fifth resistor 552, and a body terminal (B) coupled to the bias generating unit 53 for receiving the bias voltage ($V_{BIAS}$) therefrom.

The third N-type transistor 545 has a first terminal (T1) for receiving the switching control signal from the core circuit 61, a second terminal (T2) coupled to the gate terminal (G) of the first P-type transistor 541, a gate terminal (G) adapted to be coupled to the power source 71 via the fifth resistor 553, and a body terminal (B) adapted to be coupled to the ground terminal 73.

The fourth N-type transistor 546 has a first terminal (T1) adapted to be coupled to the ground terminal 73, a second terminal (T2) coupled to the gate terminal (G) of the fifth P-type transistor 542, a gate terminal (G) adapted to be coupled to the power source 71 via the seventh resistor 554, and a body terminal (B) adapted to be coupled to the ground terminal 73.

Optionally, in this embodiment, the switch control sub-unit 540 (as shown in FIG. 4) of the switch unit 54 further includes a fifth N-type transistor 547 that has a first terminal (T1) adapted to be coupled to the ground terminal 73, a second terminal (T2) coupled to the first terminal (T1) of the fourth N-type transistor 546, a gate terminal (G) for receiving an output enabling signal from the core circuit 61, and a body terminal (B) adapted to be coupled to the ground terminal 73. The fifth N-type transistor 547 permits electrical connection between the fourth N-type transistor 546 and the ground terminal 73 according to the output enabling signal.

When the power source 71 is turned on (i.e., the voltage ($V_{DD}$) is greater than zero), and the voltage at the output terminal 72 is not greater than the voltage ($V_{DD}$), the sixth and seventh P-type transistors 543, 544 are turned off, and the third N-type transistor 545 is turned on. If the fifth N-type transistor 547 is turned on by the output enabling signal, the fourth N-type transistor 546 is turned on such that the ground potential at the ground terminal 73 is transferred to the gate terminal (G) of the fifth P-type transistor 542, thereby turning on the fifth P-type transistor 542. At this time, since the third N-type transistor 545 is turned on and the sixth P-type transistor 543 is turned off, the switching control signal is transferred to the gate terminal (G) of the first P-type transistor 541 so as to control whether the first P-type transistor 541 is to be turned on or turned off.

On the other hand, when the power source 71 is turned off (i.e., the voltage ($V_{DD}$) is equal to zero), and the voltage at the output terminal 72 is greater than the voltage ($V_{DD}$), the sixth and seventh P-type transistors 543 are turned on, and the fourth N-type transistor 546 is turned off, such that the voltage at the output terminal 72 is transferred to the gate terminal (G) of the fifth P-type transistor 542, thereby turning off the fifth P-type transistor 542. At this time, since the third N-type transistor 545 is turned off and the sixth P-type transistor 543 is turned on, the voltage at the output terminal 72 is transferred to the gate terminal (G) of the first P-type transistor 541, thereby turning off the first P-type transistor 541. With the absence of current paths from the output terminal 72 to the power source 71 and to the ground terminal 73 and for the switching control signal, leakage current is prevented.

It should be noted herein that the fourth to seventh resistors 551-554 are added to this embodiment for preventing the sixth P-type transistor 543, the seventh P-type transistor 544, the third N-type transistor 545, and the fourth N-type transistor 546 from damage by events of electrical static discharge (ESD). Therefore, the fourth to seventh resistors 551-554 may be omitted in other embodiments of the present invention, where ESD is not an important consideration. Under such a circumstance, the gate terminals (G) of the sixth F-type transistor 543, the seventh P-type transistor 544, the third N-type transistor 545, and the fourth N-type transistor 546 are connected to the power source 71.

It should be further noted herein that the fifth N-type transistor 547, which is controlled by the output enabling signal, is also optional. The fifth N-type transistor 547 is added to this embodiment for permitting common use of the output terminal 72 or for preventing current from flowing from the output terminal 72 to the power source 71 when the voltage at the output terminal 72 is greater than a non-zero voltage ($V_{DD}$) at the power source 71 (i.e., the power source 71 is turned on). The fifth N-type transistor 547 may be omitted in other embodiments of the present invention, where the first terminal (T1) of the fourth N-type transistor 546 is connected to the ground terminal 73.

Moreover, it should also be noted herein that the switching control signal is used to control whether the resistor unit 51 can be used as a pull-up resistor. When the first P-type transistor 541 is turned on according to the switching control signal, the resistor unit 51 provides the voltage at the output terminal 72. When the first P-type transistor 541 is turned off according to the switching control signal, the resistor unit 51 serves no function.

It should be noted herein that each of the P-type transistors is a P-type MOSFET (PMOS) and each of the N-type transistors is a N-type MOSFET (NMOS) in this embodiment.

Figure 8:
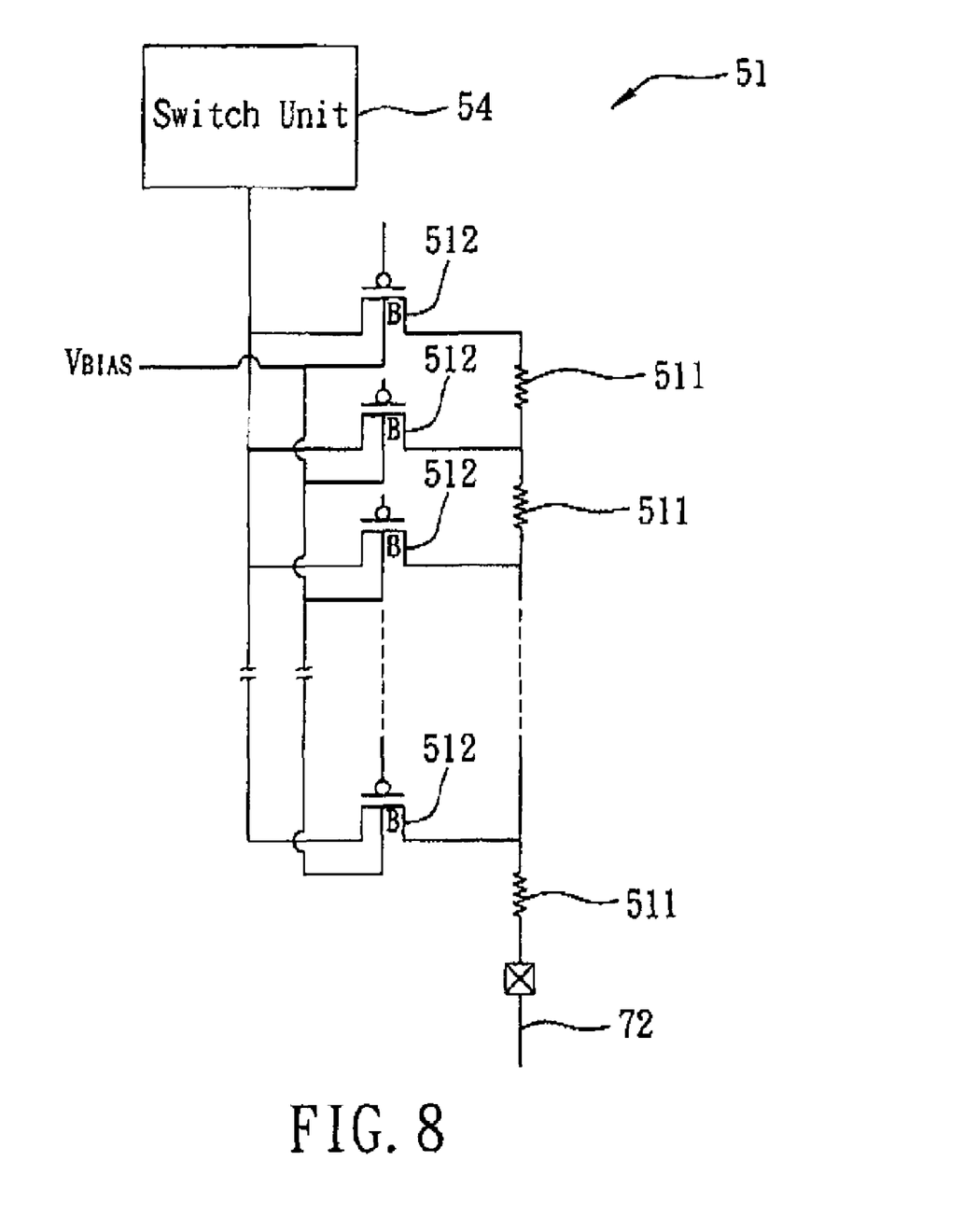
FIG. 8 is a circuit diagram illustrating a first configuration of a resistor unit of the second embodiment.
Figure 9:
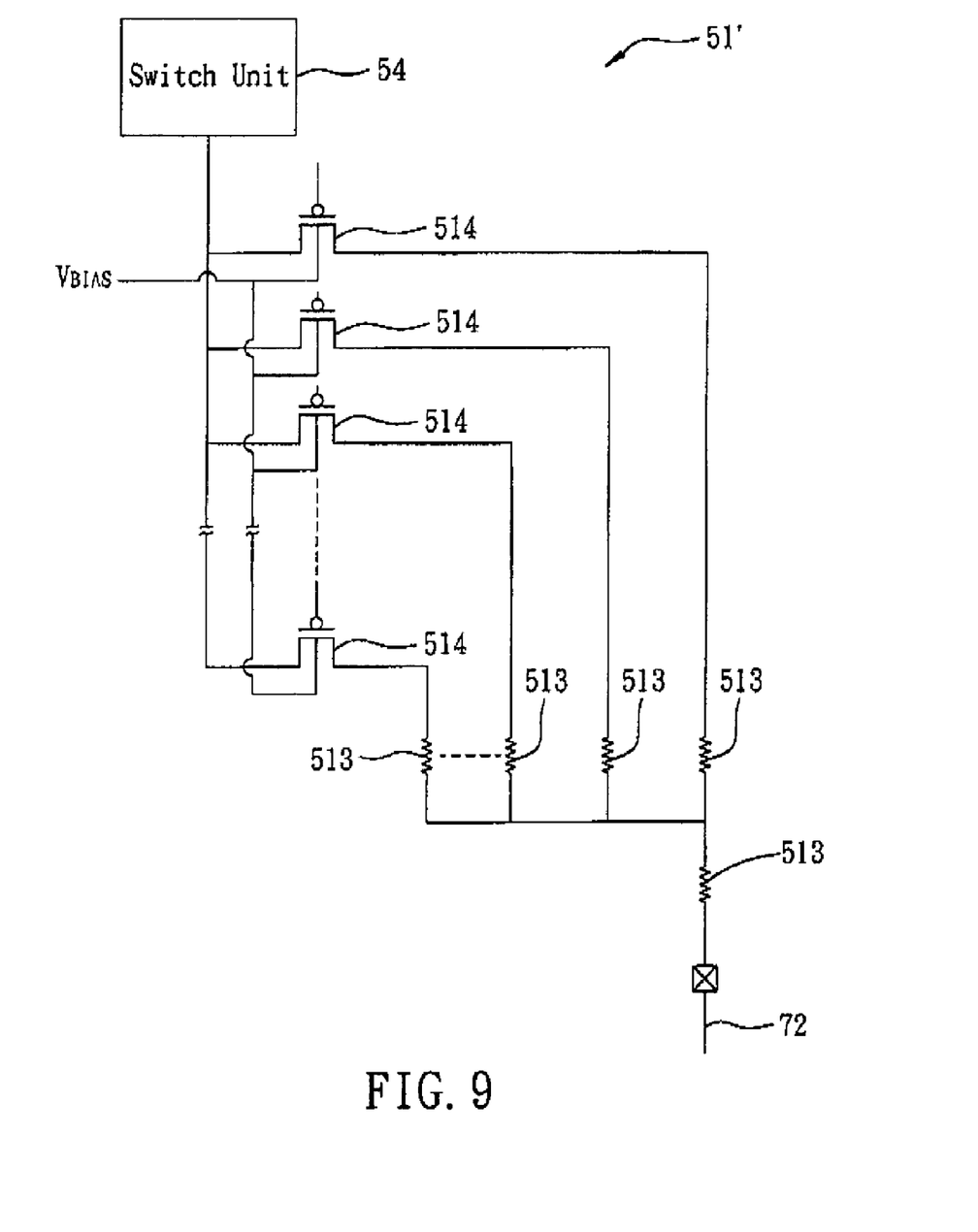
FIG. 9 is a circuit diagram illustrating a second configuration of the resistor unit of the second embodiment.

The resistor unit 51 may be a variable resistor unit. As shown in FIG. 8, in a first configuration, the resistor unit 51 includes a plurality of resistors 511 connected in series, and a plurality of switches 512. Each of the switches 512 is a P-type MOS transistor (PMOS) that has a body terminal (B) coupled to the second terminal (T2) of the second P-type transistor 531 (see FIG. 6) for receiving the bias voltage ($V_{BIAS}$) therefrom. The switches 531 control the series connections between the resistors 511, thereby controlling the effective resistance of the resistor unit 51. As shown in FIG. 9, in a second configuration, the resistor unit 51' includes a plurality of resistors 513, and a plurality of switches 514. Each of the switches 514 is a P-type MOS transistor (PMOS) that has a body terminal (B) coupled to the second terminal (T2) of the second P-type transistor 531 (see FIG. 6) for receiving the bias voltage ($V_{BIAS}$) therefrom. The switches 514 control parallel connections between the resistors 513, thereby controlling the effective resistances of the resistor unit 51'. Consequently, even if the resistance of the resistors 511, 513 drift from ideal values due to semiconductors manufacturing process drifts, the desired resistance can still be obtained for the resistor unit 51, 51' through control of the switches 512, 514.

It should be noted herein that although the resistors 511 have series connections in the first configuration, and the resistors 513 have parallel connections in the second configuration, the resistor unit 51 may be configured to have a combination of both series and parallel connections in other embodiments of the present invention. Since such a configuration can be readily appreciated by those skilled in the art, further details of the same are omitted herein for the sake of brevity.

In sum, since the leakage current suppressing circuit 2, 5 (respectively shown in FIG. 3 and FIG. 4) is embedded in a chip 30, 60, cost of the same is reduced. In addition, by replacing the diode 125, 135 of FIG. 1 with the first P-type transistor 541 of the switch unit 54, voltage drop thereacross is reduced. Furthermore, by making the voltage at the base terminal (B) of every P-type transistor 512, 514, 531, 532, 533, 541, 542, 543, 544 of the resistor unit 51, 51', the bias generating unit 53 and the switch unit 54 equal to the voltage at the output terminal 72, and by suitably arranging the on/off states of the P-type and N-type transistors of the resistor unit 51, 51', the bias generating unit 53 and the switch unit 54 when the power source 71 is turned off, leakage current is prevented from flowing from the output terminal 72 to the power source 71. Moreover, the resistor unit 51, 51' provides a calibration capability for achieving the desired resistance value in the chip 30, 60.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A leakage current suppressing circuit adapted to be coupled to a power source and an output terminal, comprising:
    a bias generating unit adapted to be coupled to the power source and the output terminal, and generating a bias voltage substantially equal to a voltage at the power source when the power source is turned on, and substantially equal to a voltage at the output terminal when the power source is turned off,
    and
    a switch unit including
        a first P-type transistor having a first terminal adapted to be coupled to the power source, a second terminal adapted to be coupled to the output terminal, a gate terminal, and a body terminal coupled to the bias generating unit for receiving the bias voltage therefrom,
    wherein the bias generating unit includes:
        a second P-type transistor having a first terminal adapted to be coupled to the output terminal, a second terminal coupled to the first P-type transistor of the switch unit for outputting the bias voltage thereto, a gate terminal adapted to be coupled to the power source, and a body terminal coupled to the second terminal thereof;
        a third P-type transistor having a first terminal adapted to be coupled to the power source, a second terminal coupled to the second terminal of the second P-type transistor, and a body terminal coupled to the second terminal of the second P-type transistor; and
        a fourth P-type transistor having a first terminal adapted to be coupled to the output terminal and a second terminal coupled to the gate terminal of the third P-type transistor.

2. The leakage current suppressing circuit as claimed in claim 1, adapted to be further coupled to a ground terminal, wherein the bias generating unit further includes:
    the fourth P-type transistor having a gate terminal adapted to be coupled to the power source and a body terminal coupled to the second terminal of the second P-type transistor; and
    a first N-type transistor having a first terminal adapted to be coupled to the ground terminal, a second terminal coupled to the gate terminal of the third P-type transistor, a gate terminal adapted to be coupled to the power source, and a body terminal adapted to be coupled to the ground terminal.

3. The leakage current suppressing circuit as claimed in claim 1, wherein the switch unit further includes a switch control sub-unit adapted to be coupled to the power source and the output terminal, the switch control sub-unit being coupled to the first P-type transistor, and being operable to transmit a switching control signal to the gate terminal of the first P-type transistor when the power source is turned on, and to transmit the voltage at the output terminal to the gate terminal of the first P-type transistor when the power source is turned off.

4. The leakage current suppressing circuit as claimed in claim 3, adapted to be further coupled to a ground terminal, wherein the switch control sub-unit of the switch unit includes:
    a fifth P-type transistor having a first terminal adapted for receiving the switching control signal, a second terminal coupled to the gate terminal of the first P-type transistor, a gate terminal, and a body terminal coupled to the bias generating unit for receiving the bias voltage therefrom;
    a sixth P-type transistor having a first terminal adapted to be coupled to the output terminal, a second terminal coupled to the gate terminal of the first P-type transistor, a gate terminal adapted to be coupled to the power source, and a body terminal coupled to the bias generating unit for receiving the bias voltage therefrom;
    a seventh P-type transistor having a first terminal adapted to be coupled to the output terminal, a second terminal coupled to the gate terminal of the fifth P-type transistor, a gate terminal adapted to be coupled to the power source, and a body terminal coupled to the bias generating unit for receiving the bias voltage therefrom;
    a third N-type transistor having a first terminal adapted for receiving the switching control signal, a second terminal coupled to the gate terminal of the first P-type transistor, a gate terminal adapted to be coupled to the power source, and a body terminal adapted to be coupled to the ground terminal; and
    a fourth N-type transistor having a first terminal adapted to be coupled to the ground terminal, a second terminal coupled to the gate terminal of the fifth P-type transistor, a gate terminal adapted to be coupled to the power source, and a body terminal adapted to be coupled to the ground terminal.

5. The leakage current suppressing circuit as claimed in claim 1, further comprising a resistor unit adapted to be coupled between the second terminal of the first P-type transistor of the switch unit and the output terminal.

6. The leakage current suppressing circuit as claimed in claim 1, further comprising a variable resistor unit adapted to be coupled between the second terminal of the first P-type transistor of the switch unit and the output terminal.

7. The leakage current suppressing circuit as claimed in claim 6, wherein the variable resistor unit includes a plurality of resistors and a plurality of switches controlling series connections between the resistors.

8. The leakage current suppressing circuit as claimed in claim 6, wherein the variable resistor unit includes a plurality of resistors and a plurality of switches controlling parallel connections between the resistors.

9. The leakage current suppressing circuit as claimed in claim 2, wherein the bias generating unit further includes a second N-type transistor having a first terminal adapted to be coupled to the ground terminal, a second terminal coupled to the first terminal of the first N-type transistor, a gate terminal adapted for receiving a bias voltage control signal, and a body terminal adapted to be coupled electrically to the ground terminal, the bias generating unit permitting electrical connection between the first N-type transistor and the ground terminal according to the bias voltage control signal.

10. The leakage current suppressing circuit as claimed in claim 4, wherein the switch control sub-unit of the switch unit further includes a fifth N-type transistor that has a first terminal adapted to be coupled to the ground terminal, a second terminal coupled to the first terminal of the fourth N-type transistor, a gate terminal adapted for receiving an output enabling signal, and a body terminal adapted to be coupled to the ground terminal, the fifth N-type transistor permitting electrical connection between the fourth N-type transistor and the ground terminal according to the output enabling signal.

11. A semiconductor chip adapted to be coupled to a power source and an output terminal, comprising:
a core circuit adapted to be coupled to the output terminal;
a resistor unit adapted to be coupled to the output terminal;
a unidirectional current circuit adapted to be coupled between the resistor unit and the power source for permitting current flow from the power source to the output terminal when the power source is turned on, and for essentially suppressing current flow from the output terminal to the power source when the power source is turned off; and
a semiconductor substrate, on which the core circuit, the resistor unit and the unidirectional current circuit are commonly disposed, the semiconductor chip being adapted to be further coupled to a ground terminal, wherein a bias generating unit of the unidirectional current circuit includes:
a first P-type transistor having a first terminal adapted to be coupled to the output terminal, a second terminal coupled to a second P-type transistor of a switch unit for outputting the bias voltage thereto, a gate terminal adapted to be coupled to the power source, and a body terminal coupled to the second terminal thereof;
a third P-type transistor having a first terminal adapted to be coupled to the power source, a second terminal coupled to the second terminal of the first P-type transistor, and a body terminal coupled to the second terminal of the first P-type transistor; and
a fourth P-type transistor having a first terminal adapted to be coupled to the output terminal and a second terminal coupled to the gate terminal of the third P-type transistor.

12. The semiconductor chip as claimed in claim 11, wherein the unidirectional current circuit includes a diode that has an anode adapted to be coupled to the power source, and a cathode coupled to the resistor unit.

13. The semiconductor chip as claimed in claim 12, wherein the unidirectional current circuit includes:
the bias generating unit, wherein the bias generating unit is adapted to be coupled to the power source and the output terminal, and generating a bias voltage substantially equal to a voltage at the power source when the power source is turned on, and substantially equal to a voltage at the output terminal when the power source is turned off; and
the switch unit including
the second P-type transistor having a first terminal adapted to be coupled to the power source, a second terminal adapted to be coupled to the output terminal, a gate terminal, and a body terminal coupled to the bias generating unit for receiving the bias voltage therefrom.

14. The semiconductor chip as claimed in claim 13, wherein the bias generating unit of the unidirectional current circuit further includes:
the fourth P-type transistor having a gate terminal adapted to be coupled to the power source and a body terminal coupled to the second terminal of the second P-type transistor; and
a first N-type transistor having a first terminal adapted to be coupled to the ground terminal, a second terminal coupled to the gate terminal of the third P-type transistor, a gate terminal adapted to be coupled to the power source, and a body terminal adapted to be coupled to the ground terminal.

15. The semiconductor chip as claimed in claim 13, wherein the core circuit outputs a switching control signal, and the switch unit of the unidirectional current circuit further includes a switch control sub-unit adapted to be coupled to the power source and the output terminal, the switch control sub-unit being coupled to the first P-type transistor, and being operable to transmit the switching control signal to the gate terminal of the first P-type transistor when the power source is turned on, and to transmit the voltage at the output terminal to the gate terminal of the first P-type transistor when the power source is turned off.

16. The semiconductor chip as claimed in claim 15, adapted to be further coupled to a ground terminal, wherein the switch control sub-unit of the switch unit includes:
a fifth P-type transistor having a first terminal for receiving the switching control signal from the core circuit, a second terminal coupled to the gate terminal of the first P-type transistor, a gate terminal, and a body terminal coupled to the bias generating unit for receiving the bias voltage therefrom;
a sixth P-type transistor having a first terminal adapted to be coupled to the output terminal, a second terminal coupled to the gate terminal of the first P-type transistor, a gate terminal adapted to be coupled to the power source, and a body terminal coupled to the bias generating unit for receiving the bias voltage therefrom;
a seventh P-type transistor having a first terminal adapted to be coupled to the output terminal, a second terminal coupled to the gate terminal of the fifth P-type transistor, a gate terminal adapted to be coupled to the power source, and a body terminal coupled to the bias generating unit for receiving the bias voltage therefrom;
a third N-type transistor having a first terminal for receiving the switching control signal from the core circuit, a second terminal coupled to the gate terminal of the first P-type transistor, a gate terminal adapted to be coupled to the power source, and a body terminal adapted to be coupled to the ground terminal; and
a fourth N-type transistor having a first terminal adapted to be coupled to the ground terminal, a second terminal coupled to the gate terminal of the fifth P-type transistor, a gate terminal adapted to be coupled to the power source, and a body terminal adapted to be coupled to the ground terminal.

17. The semiconductor chip as claimed in claim 13, wherein the resistor unit is a variable resistor unit adapted to be coupled between the second terminal of the first P-type transistor of the switch unit and the output terminal.

18. The semiconductor chip as claimed in claim 17, wherein the variable resistor unit includes a plurality of resistors and a plurality of switches controlling series connections between the resistors.

19. The semiconductor chip as claimed in claim 17, wherein the variable resistor unit includes a plurality of resistors and a plurality of switches controlling parallel connections between the resistors.

20. The semiconductor chip as claimed in claim 14, wherein the core circuit outputs a bias voltage control signal, and the bias generating unit further includes a second N-type transistor having a first terminal adapted to be coupled to the ground terminal, a second terminal coupled to the first terminal of the first N-type transistor, a gate terminal for receiving the bias voltage control signal from the core circuit, and a body terminal adapted to be coupled to the ground terminal, the bias generating unit permitting electrical connection between the first N-type transistor and the ground terminal according to the bias voltage control signal.

21. The semiconductor chip as claimed in claim 16, wherein the core circuit further outputs an output enabling signal, and the switch control sub-unit of the switch unit further includes a fifth N-type transistor having a first terminal adapted to be coupled to the ground terminal, a second terminal coupled to the first terminal of the fourth N-type transistor, a gate terminal for receiving the output enabling signal from the core circuit, and a body terminal adapted to be coupled to the ground terminal, the fifth N-type transistor permitting electrical connection between the fourth N-type transistor and the ground terminal according to the output enabling signal.

* * * * *